(12) United States Patent
Pham et al.

(10) Patent No.: US 6,989,122 B1
(45) Date of Patent: Jan. 24, 2006

(54) TECHNIQUES FOR MANUFACTURING FLASH-FREE CONTACTS ON A SEMICONDUCTOR PACKAGE

(75) Inventors: Ken Pham, San Jose, CA (US); Luu Thanh Nquyen, San Jose, CA (US); William Paul Mazotti, San Martin, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 287 days.

(21) Appl. No.: 10/274,056

(22) Filed: Oct. 17, 2002

(51) Int. Cl.
*B29C 45/02* (2006.01)
*B29C 45/14* (2006.01)
*B29C 45/37* (2006.01)

(52) U.S. Cl. .......................... 264/272.15; 264/272.17; 264/276

(58) Field of Classification Search ........... 264/272.11, 264/272.14, 272.15, 272.17, 275, 276, 337, 264/338; 425/116, 436 R, 470; 29/825, 29/831, 832
See application file for complete search history.

(56) References Cited

U.S. PATENT DOCUMENTS

| | | | |
|---|---|---|---|
| 5,139,969 A | | 8/1992 | Mori |
| 5,356,578 A | * | 10/1994 | Isomura et al. ............... 264/42 |
| 5,380,349 A | * | 1/1995 | Taniguchi et al. ............ 65/286 |
| 5,663,104 A | * | 9/1997 | Fukuyama .................. 438/123 |
| 5,904,505 A | * | 5/1999 | Hotta et al. ................. 438/124 |
| 6,077,472 A | * | 6/2000 | Kataoka et al. ............. 264/338 |
| 6,261,501 B1 | * | 7/2001 | Miyagawa et al. .... 264/272.15 |

* cited by examiner

*Primary Examiner*—Angela Ortiz
(74) *Attorney, Agent, or Firm*—Beyer Weaver & Thomas LLP

(57) ABSTRACT

Techniques for forming packaged semiconductor devices having top surfaces with flash-free electrical contact surfaces are described. According to one aspect, a molding cavity is provided which has a molding surface that is sufficiently smooth such that when placed in contact with an electrically conductive contact, gaps between the conductive contact and the mold cavity surface do not form.

3 Claims, 4 Drawing Sheets

TECHNIQUES FOR MANUFACTURING FLASH-FREE CONTACTS ON A SEMICONDUCTOR PACKAGE

CROSS-REFERENCE TO RELATED APPLICATIONS

This application is related to U.S. Pat. No. 6,364,542, filed May, 9, 2000, entitled "Device and Method for Providing a True Semiconductor to External Fiber Optic Cable Connection," to U.S. patent application Ser. No. 09/922,598, filed Jul. 11, 2001, entitled "Techniques for Joining an Optoelectronic Module to a Semiconductor Package", to U.S. patent application Ser. No. 09/822,601, filed Aug. 14, 2001, entitled "Optical Sub-Assembly for Opto-Electronic Modules", to U.S. patent application Ser. No. 09/963,039, filed Sep. 18, 2001, entitled "Techniques for Attaching Rotated Photonic Devices to an Optical Sub-Assembly in an Optoelectronic Package", and to U.S. patent application Ser. No. 10/165,711, filed Jun. 6, 2002, entitled "Ceramic Optical Sub-Assembly for Opto-Electronic Modules," the content of each of which are hereby incorporated by reference.

FIELD OF THE INVENTION

The present invention relates generally to semiconductor packaging processes, and more specifically to manufacturing semiconductor packages having flash-free electrical contact surfaces.

BACKGROUND OF THE INVENTION

In conventional semiconductor packaging processes, a resin material is used to encapsulate the semiconductor die. Since these packages need to be connected to printed circuit boards or other devices, it is necessary to avoid depositing the resin on the electrical contact leads. The typical mold cavity does not form a perfect seal with the surfaces and edges of the device enclosed by the cavity. Wherever gaps exist between the mold cavity and the device, there is a potential for resin material to be deposited in unwanted areas. This unwanted layer of mold compound resin, or resin and fillers is called flash. The thickness of the flash can vary from a thickness of a few microns up to a thickness of tens of microns and depends on the composition of the mold compound (e.g. epoxy resin and filler distribution and size), the mold press clamping tonnage, the mold pressure used, and the design of the tool cavity. When flash forms on electrical contact leads, for instance, post-plating operations cannot proceed since metal cannot be deposited on the insulating layer. Typically, flash can be removed by a number of operations such as, but not limited to, sandblasting, wet chemical exposure, and flame-off.

Flash is especially troubling when implementing the solder uplink concept disclosed in U.S. Pat. No. 6,364,542, "Device and method for providing a true semiconductor die to external fiber optic cable connection", which is hereby incorporated in its entirety by reference. FIG. 1 illustrates a cross-sectional view of a stacked molded package as constructed according to current manufacturing techniques. The solder uplink concept, illustrated in FIG. 1, involves the fabrication of a stacked molded package 100 by connecting a mother package 105 to a daughter package 155 through solder bump pads 115. The problem is that it has been found that the typical transfer molding operation with standard mold tooling creates a thin flash layer covering some or all of the top surfaces of the solder bump pads 115 that are intended to be exposed through the molding material 135 on the mother package 105. FIG. 2A illustrates an isometric view of the injection molding process. In FIG. 2A, the molding compound 135 is shown flowing across the mother integrated circuit die 110. Note that the inside bottom surface 210 of the mold cavity 215 makes contact with the top surface of the solder balls 115. Note further the formation of flash 200 on the top surface of the solder balls 115. Specifically, flash 200 is represented where molding material 135 flows onto the top surfaces of solder balls 115. This occurs because a standard mold chamber has surfaces that are not completely smooth. Typically, a mold chamber surface will have a roughness of approximately 1.2 $R_A$ (micron average roughness) or more. The roughness of the mold chamber surface allows gaps 205 to form between the inside surface 210 of the mold chamber and the top surface of the solder balls 115. Molding resin and/or fillers seep between inside bottom surface 210 of mold cavity 215 and the tops of the solder bump pads 115. FIG. 2B illustrates a magnified view of how molding material 135 flows into gaps 205 left between inside bottom surface 210 and the surface of solder bump pads 115, causing flash 200. In this case, flash is catastrophic since the resin layer prevents good mechanical and electrical contact between solder balls 115 on mother package 100 and solder balls 150 on daughter package 155.

Unfortunately, conventional means of removing flash are not desirable since they are slow and require additional equipment. It is desirable to develop techniques for creating flash free solder bump contacts on the top surface of semiconductor packages without the use of additional equipment or processing steps. Eliminating flash in the production of the mother package 100 will simplify the manufacturing steps, reduce costs, and enhance the reliability of the resulting module.

BRIEF SUMMARY OF THE INVENTION

The present invention is directed to an apparatus that satisfies the need to create flash free electrical contacts on the top surface of semiconductor packages without the need for additional equipment or processing steps after the injection molding step. The apparatus includes a molding chamber with a top molding cavity that has an exceptionally smooth inside surface. The smooth surface allows for better contact between the top molding cavity and the tops of the electrical contacts on the top surface of a given semiconductor package, which in turn prevents molding material from flowing between the surface of the molding cavity and the tops of the electrical contacts. The result is that the electrical contacts are substantially flash free after the injection molding step.

As an apparatus, one embodiment of the present invention includes at least a molding chamber including a bottom molding cavity to support a semiconductor die and a top molding cavity with an inside surface having a surface roughness of approximately less than 1.2 $R_A$.

As a method, one embodiment of the present invention includes at least providing the apparatus described above, placing a semiconductor device with an array of electrical connectors on its top surface in the apparatus, lowering the top molding cavity onto the semiconductor device such that the molding cavity comes into direct contact with the array of electrical connectors, and injecting molding compound into the molding cavity such that there is no flash formation on the top surfaces of the electrical connectors.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1:
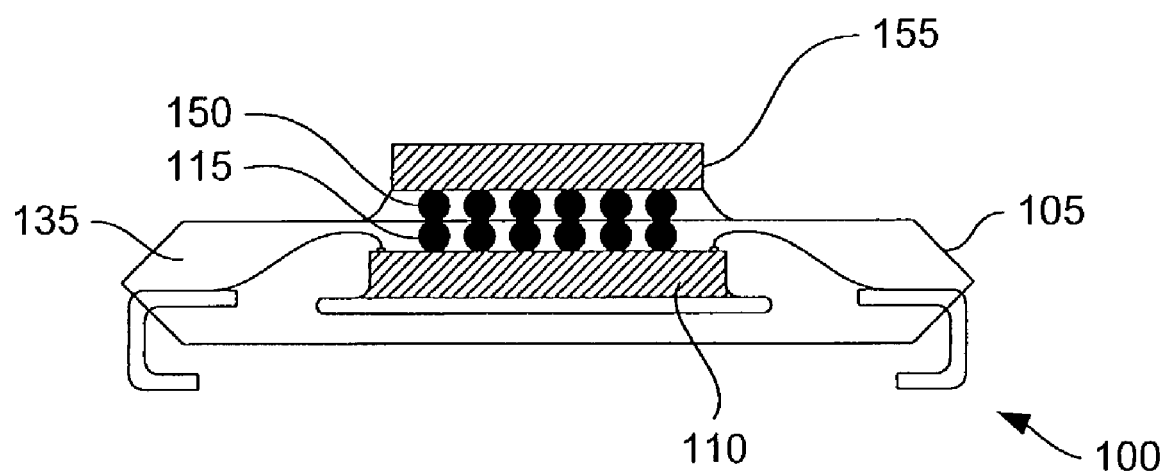
FIG. 1 illustrates a cross-sectional view of a stacked molded package as constructed according to current manufacturing techniques.
Figure 2A:
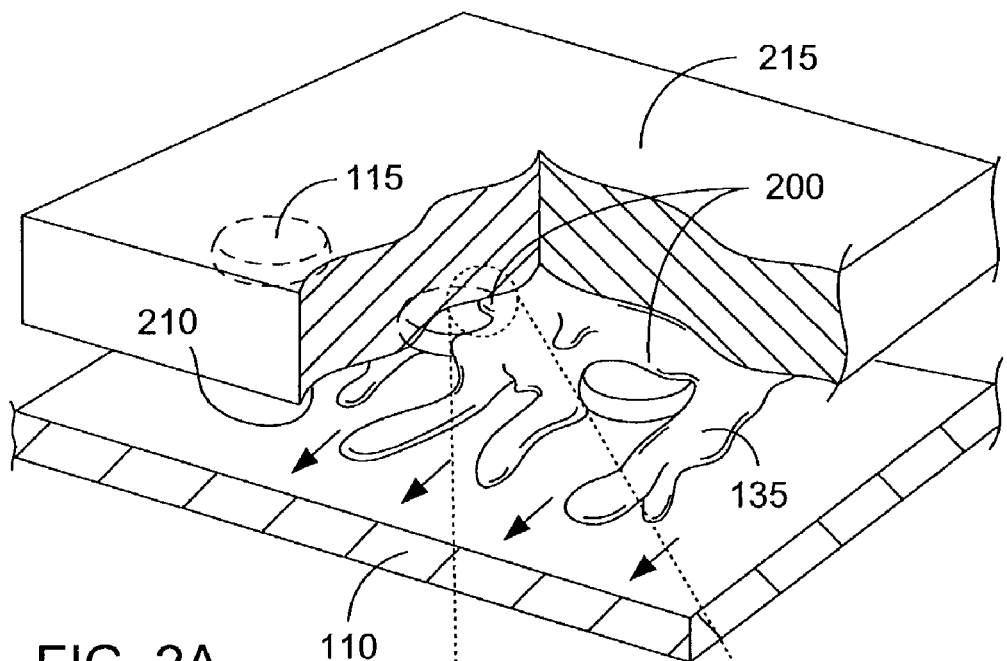
FIG. 2A illustrates an isometric view of the injection molding process.
Figure 2B:
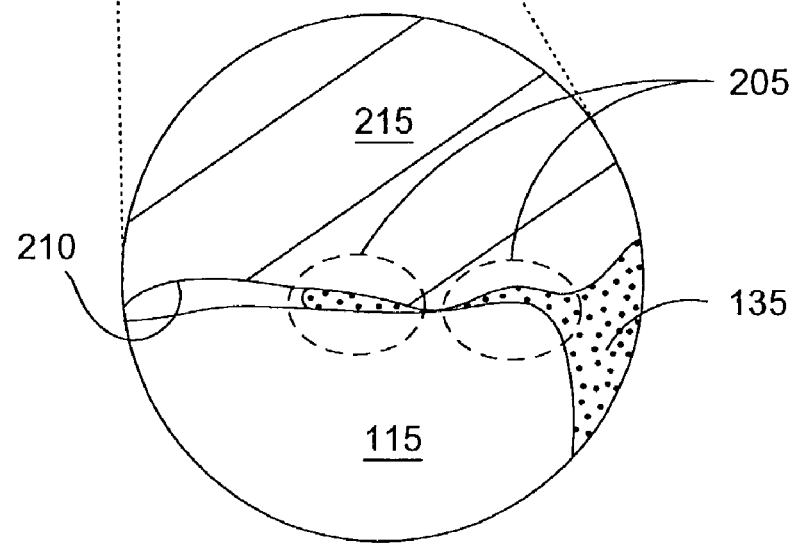
FIG. 2B illustrates a magnified view of how molding material flows into gaps formed between the molding cavity surface and the solder bumps.

While the present invention will be described with reference to a few specific embodiments, the description is illustrative of the invention and not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

The present invention pertains to techniques for forming packaged semiconductor devices having top surfaces with flash-free electrical contact surfaces. The techniques involve using a molding cavity having a surface that is sufficiently smooth such that when placed in contact with an electrically conductive contact, gaps between the conductive contact and the mold cavity surface do not form. Molding material typically seeps into these gaps during molding processes and then cures into flash formations. The present invention prevents flash from forming on contact surfaces by substantially eliminating the gaps between a molding cavity surface and the contact surface.

Figure 3A:
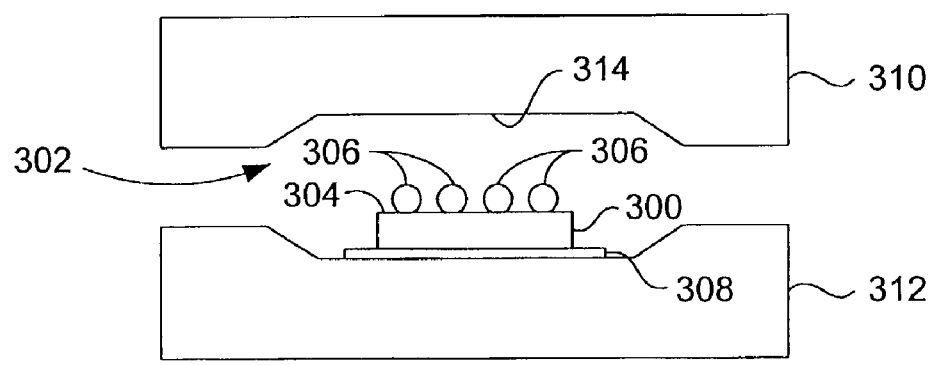
FIG. 3A illustrates a side plan, cross-sectional view of a semiconductor die that is positioned within a molding chamber.
Figure 3B:
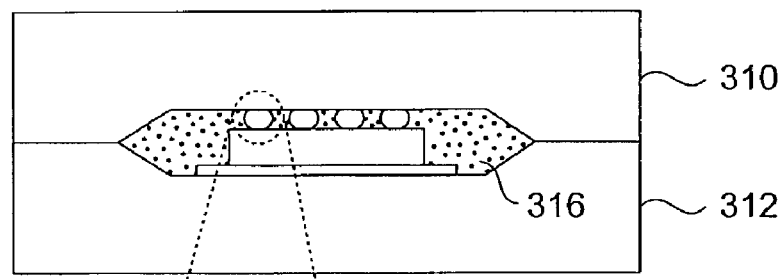
FIG. 3B illustrates a side-plan, cross-sectional view of semiconductor die that is enclosed within molding chamber.
Figure 4:
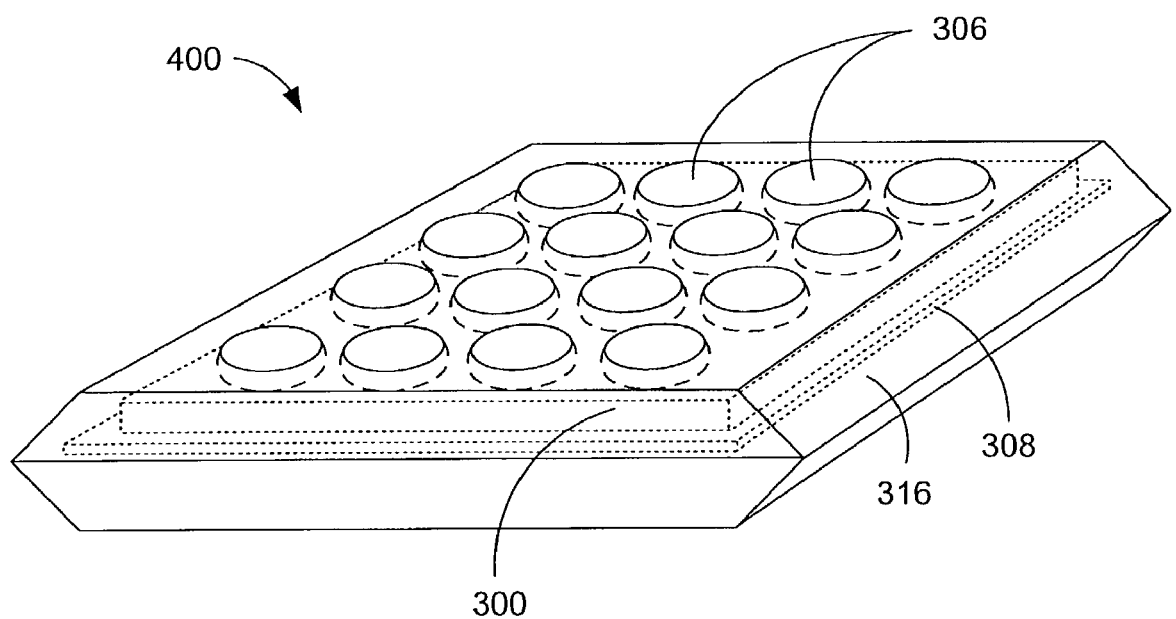
FIG. 4 illustrates a perspective view of a mother semiconductor package formed after the molding process described in FIGS. 3A and 3B.

FIGS. 3A, 3B and 4 illustrate the process for forming packaged semiconductor devices according to one embodiment of the present invention. First, FIG. 3A illustrates a side plan, cross-sectional view of a semiconductor die 300 that is positioned within a molding chamber 302. Semiconductor die 300 has a top surface 304 that contains contact pads upon which are formed electrically conductive contacts 306. In FIG. 3A, semiconductor die 300 is mounted onto a die attach pad 308, however, die attach pad 308 is not required in alternative implementations of the present invention. Molding chamber 302 is formed by a top molding cavity 310 and a bottom molding cavity 312.

After semiconductor die 300 is placed into molding chamber 302, top molding cavity 310 is lowered onto bottom molding cavity 312. FIG. 3B illustrates a side-plan, cross-sectional view of semiconductor die 300 that is enclosed within molding chamber 302. As top molding cavity 310 is lowered onto bottom molding cavity 312, top molding cavity surface 314 comes into contact with electrically conductive contacts 306 and causes contacts 306 to deform. The substantially flat top molding cavity surface 314 deforms the top portions of electrically conductive contacts 306 so that they also have substantially flat surfaces. Electrically conductive contacts 306 deform because they are typically made of a malleable material. In the embodiment shown, electrically conductive contacts 306 are solder bumps.

In alternate embodiments, electrically conductive contacts 306 are already flat prior to contact with top molding cavity surface 314 of top molding cavity 312. Furthermore, such electrically conductive contacts need not be malleable.

Top molding cavity surface 314 of top molding cavity 310 has a surface roughness of approximately less than 1.2 $R_A$. This extremely smooth surface forms an intimate contact with the tops of the electrically conductive contacts 306, substantially minimizing the formation of gaps between the top molding cavity surface 314 of the top molding cavity 310 and the tops of the electrically conductive contacts 306. In some embodiments of the invention, $R_A$ is approximately equal to or less than 0.5. Further, in some embodiments of the invention, $R_A$ is approximately equal to or less than 0.1. Generally, as $R_A$ decreases, fewer gaps are formed between top molding cavity surface 314 and electrically conductive contacts 306 since top molding cavity surface 314 will contain fewer surface imperfections such as recesses. Some embodiments of the present invention will employ a top molding cavity 310 having top molding cavity surface 314 that has been made smooth by the use of standard machine tools. Other embodiments will achieve the same effect by applying a surface coating over top molding cavity surface 314 that substantially smoothens the surface imperfections. In yet other embodiments, top molding cavity surface 314 is manufactured to have an average surface roughness of less than 1.2 $R_A$ and additionally provided with a surface coating for increased smoothness. Various materials, including metallic materials such as nickel, can be used as a surface coating material. Those skilled in the art will recognize that other means of smoothing top molding cavity surface 314 of top molding cavity 310 are also possible.

After semiconductor die 300 and electrically conductive contacts 306 are enclosed in molding chamber 302, a molding compound 316 is injected into molding chamber 302. Because of the intimate contact between inside top surface 314 and electrically conductive contacts 306, substantially no molding compound seeps in between top molding cavity surface 314 and contacts 306. This is because the intimate contact forces molding compound 316 to preferentially flow around the sides of contacts 306 rather than over the top of contacts 306. Thus, there is substantially no flash formation on the top surface of the electrically conductive contacts 306. See magnified view, FIG. 3C, showing a single electrically conductive contact 306 with substantially no molding compound deposited between top molding cavity surface 314 and electrically conductive contacts 306.

Figure 3C:
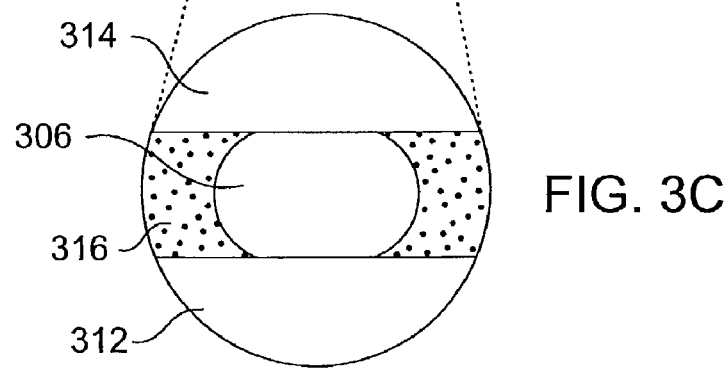
FIG. 3C illustrates a magnified view of one of the electrically conductive contacts of FIG. 3B.

FIG. 4 illustrates a perspective view of a mother semiconductor package 400 formed after the molding process described in FIGS. 3A–3C. The cured molding compound 316 of semiconductor package 400 contains integrated circuit die 300, die attach pad 308 and electrically conductive contacts 306. Due to the constraints of top cavity molding surface 314, electrically conductive contacts 306 are exposed through the top surface of molding material 316. The top surfaces of contacts 306 are also flat and coplanar with the top surface of the cured molding compound 316. Advantageously, the top surfaces of electrically conductive contacts 306 are substantially flash-free since the molding compound 316 did not flow between top cavity surface 314 of molding chamber 302 and the top surfaces of contacts 306 during the molding process (see FIG. 3C).

The advantage of electrically conductive contacts 306 having substantially flash-free top surfaces of is that the process of attaching a daughter package 155 (as shown in FIG. 1) is simplified. This is because it is not necessary to perform post-molding process operations such as sanding, buffering, or cleaning to remove flash from the top surfaces of electrically conductive contacts 306 before attaching the daughter package 155. Therefore, processes for attaching a daughter package can begin immediately after the molding process shown in FIG. 3B.

In one embodiment of the present invention, a Towa Model M60 Mold Press (referred to as "Towa press") is used to carry out the injection molding process. When using the Towa press, it has been found that the settings in Table 1, Operational Settings for Towa Model M60 Mold Press in the Context of the Current Invention, provide acceptable results.

TABLE 1

Operational Settings for Towa Model M60 Mold Press in the Context of the Current Invention.

| Mold Setting | Injection Setting | Clamp Pressure |
|---|---|---|
| Cure Time: 80 sec. | Transfer Pressure: 0.18 ton | Chase Pressure: 2 tons |
| Mold Temperature: 170° C. | Transfer Speed 1.8 to 2.0 m/s | |
| Clamp Pressure: 18–20 tons | | |

Note that the above settings may vary by as much as ±20% and continue to provide acceptable results. It will be understood by those familiar with the art that the injection molding process described in this application can be carried out by using other mold presses or devices that use different molding compound temperatures, pressures, and flow rates and that the above operational settings are specific to the Towa Model M60 Machine Press.

The cure time of 80 seconds is mold compound and temperature-dependent. Initiators and catalysts can be added in a number of combinations so to either speed up, or slow down, the reaction time to reach a B-stage state, which is sufficiently rigid to allow for mold removal without damaging the parts for post mold cure. Typically, reaction speed needs to be balanced with the injection speed. A slow injection speed combined with fast reaction will lead to a rapid increase in the compound viscosity, which may lead to a host of flow-induced problems such as wire sweep, voiding, and incomplete fill.

Mold temperature represents the temperature of the mold compound upon injection into the molding chamber. This is the general mold setting, although some applications may call for settings as low as 150° C. and as high as 200° C. With the latter setting, the mold compound can reach a sufficiently advanced cured state such that post curing is no longer needed.

Clamp pressure refers to the machine setting to keep the two mold halves clamped shut. This value will be machine and mold-dependent. A production mold will be larger and heavier and will therefore require more clamping tonnage.

Transfer pressure refers to the hydraulic force applied to the transfer plunger, which presses the molding material into the molding chamber. The plunger typically presses on the molding material, which is held within a chute. The Towa Model M60 uses a cylindrical mold compound pellet that is 14 mm in diameter and which weighs 3.8 gm. This translates into a machine-independent transfer pressure of 1,690 psi (or 1.16 kg/mm$^2$).

The transfer speed is the speed at which the molding material is transferred into the molding chamber from the chute. Transfer speed controls the shear rate imparted to the mold compound as it flows into the mold cavities. Shear rate is the ratio of flow front velocity over the gap that the front has to flow through. Its unit is inverse sec ($s^{-1}$). For the same transfer speed, the shear rate will vary as the gap is increased or decreased. In a mold cavity, the key gaps are the cross-section of the runner (from the pot containing the pellet), the gate (opening into the mold cavity), and the cavity upper and lower gaps (delineated by the leadframe or substrate). For a leadless leadframe panel (LLP) mold setting, the shear rates are estimated to be about 380 $s^{-1}$, 8,100 $s^{-1}$, 430 $s^{-1}$ for the runner, gate, and cavity, respectively. Such numbers are based on the flow front velocity estimated at each one of those locations. It is important to maintain those (machine-independent) settings to ensure that the proper filling of the mold cavity can be achieved. Again, variations within 20% of these machine-independent values are acceptable.

Some mold presses have a two-stage clamping process. Large (global) clamping to provide rough clamping of large platens and small (local) clamping on the chase area. The small (local) pressure is also referred to as chase pressure. Chase pressure ensures that the large pressure does not all come down on the leadframe or substrate and crush the material. The small local clamping allows more flexibility in fine-tuning the local pressure on certain areas of the mold and substrate or leadframe. Older presses have only one clamp pressure setting.

Note that the transfer pressure and speeds in Table 1 describe the settings for the Towa Model M60 Mold Press. Also provided above, are the machine-independent pressure and speed values. The machine-independent values describe the transfer pressure and speed within the molding chamber regardless of the specific mold press dimensions and characteristics. The machine-independent values of the molding process are set so that injected molding material does not force its way between the top cavity surface of a molding cavity and the conductive contact such that flash would form. The machine-independent pressure and speed of the molding material within a molding chamber should be approximately the same regardless of the specific molding press used.

In some embodiments, mother package 400 will be manufactured according to specific form factors. Form factors represent standard configurations and dimensions for the die, die attach pad, wire leads, molding material, etc. of semiconductor packages. Some exemplary form factors offered in the portfolio of the National Semiconductor Corporation (NSC) include SOP (Small Outline Package), DIP (Dual In-Line Package), PGA (Pin Grid Array), LCC (Leaded Chip Carrier), QFP (Quad Flatpack), BGA (Ball Grid Array), and CSP (Chip Sized Package). It should be noted that form factors not provided by NSC may also be suitable for this invention.

Furthermore, in some embodiments, a daughter package that is attached to mother package 400 can be an integrated circuit package, an optical submodule such as an optoelectronic transceiver, transmitter or receiver, or any other device suitable for connection to package 400 via electrically conductive contacts.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method of packaging a semiconductor die comprising:
   providing a top molding cavity that has a top molding surface with a surface roughness of less than 1.2 $R_A$;
   providing a bottom molding cavity that has a bottom molding surface, wherein the top and the bottom molding cavity form a molding chamber;
   placing the semiconductor die having one or more deformable electrically conductive contacts on a to surface of the die into the molding chamber;
   lowering the top molding cavity onto the deformable electrically conductive contacts such that the top molding surface deforms the contacts and creates an empty space between the top surface of the semiconductor die and the top molding surface; and
   injecting a molding compound into the molding chamber such that the molding compound flows through the molding chamber at 1.16 kg/mm$^2$ and such that the molding compound surrounds the deformable electrically conductive contacts and fills the empty space between the top surface of the semiconductor die and the top molding surface in a way that no flash forms on a top surface of each of the deformable electrically conductive contacts.

2. A method of packaging a semiconductor die comprising:
   providing a top molding cavity that has a top molding surface with a surface roughness of less than 1.2 $R_A$;
   providing a bottom molding cavity that has a bottom molding surface, wherein the top and the bottom molding cavity form a molding chamber;
   placing the semiconductor die having one or more deformable electrically conductive contacts on a top surface of the die into the molding chamber wherein the deformable electrically conductive contacts are solder balls;
   lowering the top molding cavity onto the deformable electrically conductive contacts such that the ton molding surface deforms the contacts and creates an empty space between the top surface of the semiconductor die and the top molding surface; and
   injecting a molding compound into the molding chamber such that the molding compound surrounds the deformable electrically conductive contacts and fills the empty space between the top surface of the semiconductor die and the top molding surface in a way that no flash forms on a top surface of each of the deformable electrically conductive contacts.

3. A method of packaging a semiconductor die comprising:
   providing a top molding cavity that has a top molding surface with a surface roughness of less than 1.2 $R_A$;
   providing a bottom molding cavity that has a bottom molding surface, wherein the top and the bottom molding cavity form a molding chamber;
   placing the semiconductor die having one or more deformable electrically conductive contacts on a top surface of the die into the molding chamber;
   lowering the top molding cavity onto the deformable electrically conductive contacts such that the ton molding surface deforms the contacts and creates an empty space between the top surface of the semiconductor die and the top molding surface;
   injecting a molding compound into the molding chamber such that the molding compound surrounds the deformable electrically conductive contacts and fills the empty space between the ton surface of the semiconductor die and the top molding surface in a way that no flash forms on a top surface of each of the deformable electrically conductive contacts; and
   attaching a secondary device to a top surface of the packaged semiconductor die such that electrical contacts of the secondary device make contact with the top surface of each of the deformable electrically conductive contacts, wherein the attaching operation is the next operation after the injecting operation.

* * * * *

UNITED STATES PATENT AND TRADEMARK OFFICE
CERTIFICATE OF CORRECTION

PATENT NO. : 6,989,122 B1 Page 1 of 1
APPLICATION NO. : 10/274056
DATED : January 24, 2006
INVENTOR(S) : Pham et al.

It is certified that error appears in the above-identified patent and that said Letters Patent is hereby corrected as shown below:

In the Title Page:

In the (75) Inventors section, change "Thanh Nquyen, San Jose, CA (US)" to --Thanh Nguyen, San Jose, CA (US)--.

In the Claims:

In line 14 of claim 2 (column 8, line 7) change "the ton" to --the top--.

In line 12 of claim 3 (column 8, line 29) change "the ton" to --the top--.

In line 19 of claim 3 (column 8, line 36) change "the ton" to --the top--.

Signed and Sealed this

Ninth Day of January, 2007

JON W. DUDAS
*Director of the United States Patent and Trademark Office*